United States Patent
Wang et al.

(10) Patent No.: US 11,848,156 B2
(45) Date of Patent: Dec. 19, 2023

(54) ELECTRONIC DEVICE COMPRISING A DIELECTRIC MATERIAL AND METHODS FOR THE MANUFACTURE THEREOF

(71) Applicant: Samsung Electronics Co., Ltd., Suwon-si (KR)

(72) Inventors: Yan Wang, Brookline, MA (US); Valentina Lacivita, Mountain View, CA (US); Ali Hamze, Somerville, MA (US); Jeong-Ju Cho, Lexington, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 394 days.

(21) Appl. No.: 17/160,533

(22) Filed: Jan. 28, 2021

(65) Prior Publication Data

US 2022/0165495 A1    May 26, 2022

Related U.S. Application Data

(60) Provisional application No. 63/118,415, filed on Nov. 25, 2020.

(51) Int. Cl.
*H01G 4/12* (2006.01)
*C01G 27/00* (2006.01)
(Continued)

(52) U.S. Cl.
CPC .......... *H01G 4/1209* (2013.01); *C01G 25/006* (2013.01); *C01G 27/006* (2013.01);
(Continued)

(58) Field of Classification Search
CPC ...... H01G 4/1209; H01G 4/306; H01G 13/00; H01L 29/78391; H01L 29/516;
(Continued)

(56) References Cited

U.S. PATENT DOCUMENTS 10,199,691 B2   2/2019  Kim et al.
11,084,734 B2 *  8/2021  Weller ................ C01G 35/006
(Continued)

FOREIGN PATENT DOCUMENTS

CN   108424134 B  *  9/2020 ......... C04B 35/2683
EP      3920280 A1 * 12/2021 ............. C03C 3/325
(Continued)

OTHER PUBLICATIONS

Kim, A. et al., "Research Progresses of Garnet-Type Solid Electrolytes for Developing All-Solid-State Li Batteries", Frontiers in Chemistry, vol. 8, Article 468, Jun. 2020; pp. 1-13.

*Primary Examiner* — Dion R. Ferguson
(74) *Attorney, Agent, or Firm* — CANTOR COLBURN LLP

(57) ABSTRACT

An electronic device comprises a first blocking electrode; a second blocking electrode; and a dielectric material disposed between the first electrode and the second electrode, the dielectric material comprising a compound of Formula 1

$$Li_{24-b*y-c*z-a*x}M^1_yM^2_zM^3_xO_{12-\delta} \quad (1)$$

wherein $M^1$ is a cationic element having an oxidation state of b, wherein b is +1, +2, +3, +4, +5, +6, or a combination thereof; $M^2$ is a cationic element having an oxidation state of c, wherein c is +1, +2, +3, +4, +5, +6, or a combination thereof; $M^3$ is a cationic element having an oxidation state of a, wherein a is +1, +3, +4, or a combination thereof; $0 \leq y \leq 3$; $0 \leq z \leq 3$; $0 \leq x \leq 5$; and $0 \leq \delta \leq 2$. Methods for the manufacture of the electronic device are also disclosed.

25 Claims, 3 Drawing Sheets

(51) Int. Cl.
*C01G 33/00* (2006.01)
*C01G 35/00* (2006.01)
*C01G 41/00* (2006.01)
*C23C 14/08* (2006.01)
*C23C 14/34* (2006.01)
*H01G 4/30* (2006.01)
*H01G 13/00* (2013.01)
*H01L 29/51* (2006.01)
*H01L 29/78* (2006.01)
*C01G 25/00* (2006.01)

(52) U.S. Cl.
CPC .......... *C01G 33/006* (2013.01); *C01G 35/006* (2013.01); *C01G 41/006* (2013.01); *C23C 14/08* (2013.01); *C23C 14/34* (2013.01); *H01G 4/306* (2013.01); *H01G 13/00* (2013.01); *H01L 29/516* (2013.01); *H01L 29/78391* (2014.09); *C01P 2002/52* (2013.01); *C01P 2002/72* (2013.01); *C01P 2006/32* (2013.01); *C01P 2006/40* (2013.01)

(58) Field of Classification Search
CPC .. C01G 25/006; C01G 27/006; C01G 33/006; C01G 35/006; C01G 41/006; C23C 14/08; C23C 14/34; C01P 2002/52; C01P 2002/72; C01P 2006/32; C01P 2006/40
See application file for complete search history.

(56) References Cited

U.S. PATENT DOCUMENTS

| | | | |
|---|---|---|---|
| 2016/0308244 A1* | 10/2016 | Badding | H01M 10/0525 |
| 2017/0047589 A1* | 2/2017 | Noi | H01M 4/62 |
| 2017/0294678 A1* | 10/2017 | Lee | H01M 4/134 |
| 2019/0337817 A1* | 11/2019 | Weller | C09D 133/02 |
| 2019/0393505 A1 | 12/2019 | Suzuki et al. | |
| 2020/0168945 A1* | 5/2020 | Koga | H01M 10/052 |
| 2020/0176815 A1 | 6/2020 | Gaben | |
| 2021/0020932 A1* | 1/2021 | Badding | H01M 10/0562 |
| 2021/0351411 A1* | 11/2021 | Roev | H01M 10/0562 |
| 2021/0376378 A1* | 12/2021 | Jung | C01G 15/006 |
| 2022/0037649 A1* | 2/2022 | Chakravarthy | H01M 4/134 |

FOREIGN PATENT DOCUMENTS

| | | | | |
|---|---|---|---|---|
| WO | WO-2019161301 A1 | * | 8/2019 | B33Y 10/00 |
| WO | WO-2019212026 A1 | * | 11/2019 | C01G 25/00 |

* cited by examiner

ELECTRONIC DEVICE COMPRISING A DIELECTRIC MATERIAL AND METHODS FOR THE MANUFACTURE THEREOF

CROSS-REFERENCE TO RELATED APPLICATION

This application claims priority to U.S. Provisional Patent Application No. 63/118,415, filed on Nov. 25, 2020, in the United States Patent and Trademark Office, and all the benefits accruing therefrom under 35 U.S.C. § 119, the content of which is incorporated herein in its entirety by reference.

FIELD

Disclosed is an electronic device comprising a first blocking electrode, a second blocking electrode, and a dielectric material disposed between the first and second blocking electrodes. Also disclosed are methods for the manufacture of the electronic device.

BACKGROUND

Various electronic devices and electronic components include ceramic dielectric materials, including, for example, field effect transistors and capacitors. Compositions comprising $BaTiO_3$ have been widely used as dielectric materials for capacitors. Available materials comprising $BaTiO_3$ having a high dielectric constant are known as ferroelectric oxide materials, where high dielectric constants (e.g., $10^3$ to $10^4$) can be achieved across the paraelectric to ferroelectric transition. Other complex oxide materials (e.g., $CaCu_3Ti_4O_{12}$) have also emerged as nonferroelectric, high dielectric constant materials, where the high dielectric constant arises from either polarization relaxation or polar fluctuations in nanosize domains. However, such materials tend to suffer from a high dielectric loss at high frequency or high field.

Thus, there remains a need for an improved dielectric material for use in an electronic device, particularly in a capacitor.

SUMMARY

An electronic device comprises a first blocking electrode; a second blocking electrode; and a dielectric material disposed between the first electrode and the second electrode, the dielectric material comprising a compound of Formula 1

(1)

wherein $M^1$ is a cationic element having an oxidation state of b, wherein b is +1, +2, +3, +4, +5, +6, or a combination thereof; $M^2$ is a cationic element having an oxidation state of c, wherein c is +1, +2, +3, +4, +5, +6, or a combination thereof; $M^3$ is a cationic element having an oxidation state of a, wherein a is +1, +3, +4, or a combination thereof; $0 \leq y \leq 3$; $0 \leq z \leq 3$; $0 \leq x \leq 5$; and $0 \leq \delta \leq 2$.

A method for the manufacture of the electronic device, wherein the electronic device is a multilayer ceramic capacitor, comprises forming a first internal blocking electrode on a first dielectric material comprising the compound of Formula 1; forming a second internal blocking electrode on a second dielectric material comprising the compound of Formula 1; forming a multilayer ceramic body by alternately disposing a plurality of first and second dielectric materials having the first and second internal blocking electrodes disposed thereon; sintering the multilayer ceramic body; and forming a first external blocking electrode and a second external blocking electrode on opposing sides of the multilayer ceramic body, wherein the first and second external blocking electrodes are electrically connected to the plurality of the first and second internal blocking electrodes.

The above described and other features are exemplified by the following figures and detailed description.

BRIEF DESCRIPTION OF THE DRAWINGS

The following figures are exemplary embodiments wherein the like elements are numbered alike.

DETAILED DESCRIPTION

Figure 1:
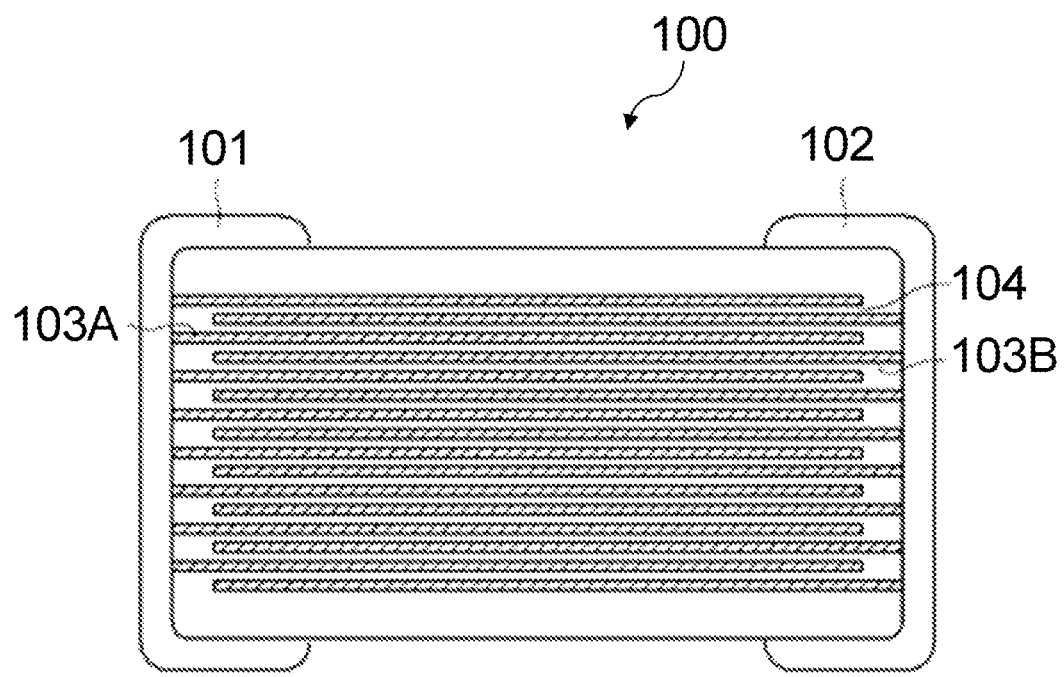
FIG. 1 is a schematic diagram of an embodiment of a multilayer ceramic capacitor (MLCC).

Disclosed is a dielectric material having improved dielectric properties. The present inventors have unexpectedly discovered that the particular solid-state ionic conductors described herein can unexpectedly provide this desirable combination of properties. Thus the dielectric material described herein may be particularly useful in an electronic device such as a field effect transistor or a capacitor.

Accordingly, an embodiment of the present disclosure is an electronic device comprising a first blocking electrode, a second blocking electrode, and a dielectric material disposed between the first blocking electrode and the second blocking electrode.

As used herein, the term "blocking electrode" refers to an electrode material which does not substantially react with lithium metal, and does not exhibit substantial ion conductivity, e.g., lithium ion conductivity, or both. For example, the blocking electrode can have a lithium ion conductivity of less than $1 \times 10^{-7}$ S/cm, e.g., $1 \times 10^{-7}$ S/cm to $1 \times 10^{-15}$ S/cm, $1 \times 10^{-8}$ S/cm to $1 \times 10^{-10}$ S/cm.

The first blocking electrode and the second blocking electrode can be the same or different in composition. The first and second blocking electrodes can each independently comprise any suitable electrically conductive metal, for example copper, nickel, silver, gold, zinc, tin, palladium, platinum, lead, molybdenum, iron, or an alloy thereof. Particularly suitable conductive metals may include copper, a copper alloy (e.g., copper-zirconium, copper-magnesium, copper-zinc, or copper-iron), nickel, or a nickel alloy (e.g., nickel-iron). In an embodiment, the first and second blocking electrodes can each independently comprise palladium, nickel, copper, gold, an alloy thereof, or a combination thereof. The first and second blocking electrodes may be provided by any suitable method. Use of sputtering or a plating method is mentioned, the details of which can be determined by one of skill in the art without undue experimentation.

A dielectric material is disposed between the first and second blocking electrodes. The dielectric material comprises a compound according to Formula 1:

$$Li_{24-b*y-c*z-a*x}M^1_yM^2_zM^3_xO_{12-\delta}$$ (Formula 1)

wherein in Formula 1, $M^1$ is a cationic element having an oxidation state of b, wherein b is +1, +2, +3, +4, +5, +6, or a combination thereof; $M^2$ is a cationic element having an oxidation state of c, wherein c is +1, +2, +3, +4, +5, +6, or a combination thereof; $M^3$ is a cationic element having an oxidation state of a, wherein a is +1, +3, +4, or a combination thereof; $0 \leq y \leq 3$; $0 \leq z \leq 3$; $0 \leq x \leq 5$; and $0 \leq \delta \leq 2$.

In an embodiment, the compound according to Formula 1 has a garnet-type structure. Garnet is a silicate that can be referred to using the formula $A^1_3A^2_2(SiO_4)_3$, wherein $A^1$ is a divalent cation, and $A^2$ is a trivalent cation. As used herein, the term "garnet" or "garnet-type structure" means that the compound is isostructural with garnet, e.g., $Mg_3Al_2(SiO_4)_3$. While not wanting to be bound by theory, it is understood that in the compound according to Formula 1, 8-fold coordinated $M^1O_8$ dodecahedra and 6-fold coordinated $M^2O_6$ octahedra may be present, and the Li and $M^3$ sites may be tetrahedral interstitial sites, octahedral interstitial sites, distorted 4-fold coordination interstitial sites, or a combination thereof.

In an embodiment, the dielectric material exhibits a dielectric constant of greater than 10, for example greater than 10 to 25, when determined at 300 Kelvin according to ASTM D150-18. In an embodiment, the dielectric material exhibits a dielectric constant of greater than $1 \times 10^3$, for example, greater than $1 \times 10^3$ to $1 \times 10^6$, $5 \times 10^3$ to $1 \times 10^5$, or $1 \times 10^4$ to $1 \times 10^5$, when determined at 300 Kelvin according to ASTM D150-18. In an embodiment, the dielectric material can exhibit a dielectric constant of greater than $1 \times 10^5$, when determined at 300 Kelvin according to ASTM D150-18.

In an embodiment, the dielectric material comprising the compound of Formula 1 exhibits an ionic conductivity of greater than 0.1 mS/cm at a temperature of 30° C. For example, the dielectric material comprising the compound of Formula 1 may have an ionic conductivity of greater than 0.1 to 100 mS/cm, 0.5 to 50 mS/cm, or 0.1 to 10 mS/cm at 30° C. Ionic conductivity may be determined by a complex impedance method at 20° C., further details of which can be found in J.-M. Winand et al., "Measurement of Ionic Conductivity in Solid Electrolytes," Europhysics Letters, vol. 8, no. 5, p. 447-452, 1989, the content of which is incorporated herein by reference in its entirety.

$M^1$ in Formula 1 may be a monovalent element, a divalent element, a trivalent element, a tetravalent element, a pentavalent element, or a hexavalent element. Stated another way, $M^1$ in Formula 1 has an oxidation state of b, wherein b is +1, +2, +3, +4, +5, +6, or a combination thereof. In an aspect, $M^1$ has an oxidation state of b, wherein b is +1 and $M^1$ is monovalent, and comprises $Na^+$, $K^+$, or a combination thereof. In an aspect, $M^1$ has an oxidation state of b, wherein b is +2 and $M^1$ is divalent, and comprises $Ca^{2+}$, $Mg^{2+}$, $Sr^{2+}$, $Ba^{2+}$, or a combination thereof. In an aspect, $M^1$ has an oxidation state of b, wherein b is +3 and $M^1$ is trivalent, and comprises $Y^{30+}$, $In^{3+}$, $La^{3+}$, $Sc^{3+}$, or a combination thereof. In an aspect, $M^1$ has an oxidation state of b, wherein b is +4 and $M^1$ is tetravalent, and comprises $Hf^{4+}$, $Zr^{4+}$, $Ti^{4+}$, $Sn^{4+}$, $Si^{4+}$, $Ge^{4+}$, or a combination thereof. In an aspect, $M^1$ has an oxidation state of b, wherein b is +5 and $M^1$ is pentavalent, and comprises $Ta^{5+}$, $Nb^{5+}$, or a combination thereof. In an aspect, $M^1$ has an oxidation state of b, wherein b is +6 and $M^1$ is hexavalent, and is $W^{6+}$. $M^1$ having an oxidation state of b, wherein b is +3 is mentioned. For example, $M^1$ comprising $La^{3+}$ is specifically mentioned.

$M^2$ in Formula 1 may be a monovalent element, a divalent element, a trivalent element, a tetravalent element, a pentavalent element, or a hexavalent element. Stated another way, $M^2$ in Formula 1 has an oxidation state of c, wherein c is +1, +2, +3, +4, +5, +6, or a combination thereof. In an aspect, $M^2$ has an oxidation state of c, wherein c is +1 and $M^2$ is monovalent, and comprises $Na^+$, $K^+$, or a combination thereof. In an aspect, $M^2$ has an oxidation state of c, wherein c is +2 and $M^2$ is divalent, and comprises $Ca^{2+}$, $Mg^{2+}$, $Sr^{2+}$, $Ba^{2+}$, or a combination thereof. In an aspect, $M^2$ has an oxidation state of c, wherein c is +3 and $M^2$ is trivalent, and comprises $Y^{3+}$, $In^{3+}$, $La^{3+}$, $Sc^{3+}$, or a combination thereof. In an aspect, $M^2$ has an oxidation state of c, wherein c is +4 and $M^2$ is tetravalent, and comprises $Hf^{4+}$, $Zr^{4+}$, $Ti^{4+}$, $Sn^{4+}$, $Si^{4+}$, $Ge^{4+}$, or a combination thereof. In an aspect, $M^2$ has an oxidation state of c, wherein c is +5 and $M^2$ is pentavalent, and comprises $Ta^{5+}$, $Nb^{5+}$, or a combination thereof. In an aspect, $M^2$ has an oxidation state of c, wherein c is +6 and $M^2$ is hexavalent, and is $W^{6+}$. $M^2$ having an oxidation state of c, wherein c is +4 is mentioned. For example, $M^2$ is $Hf^{4+}$, $Zr^{4+}$, or a combination thereof is specifically mentioned.

In an embodiment, $M^1$ and $M^2$ are present (e.g., $0<y\leq 3$ and $0<z<3$), and $M^1$ and $M^2$ are different.

$M^3$ in Formula 1 may be a monovalent element, a trivalent element, or a tetravalent element. Stated another way, $M^3$ in Formula 1 has an oxidation state of a, wherein a is +1, +3, +4, or a combination thereof. In an aspect, $M^3$ has an oxidation state of a, wherein a is +1, and $M^3$ is monovalent, and is $H^+$. In an aspect, $M^3$ has an oxidation state of a, wherein a is +3, and $M^3$ is trivalent, and $M^3$ may comprise $Al^{3+}$, $Ga^{3+}$, or a combination thereof. In an aspect, $M^3$ has an oxidation state of a, wherein a is +4, and $M^3$ is tetravalent, and $M^3$ may comprise $Sn^{4+}$, $Si^{4+}$, $Ge^{4+}$, or a combination thereof.

In an embodiment, x=0, y=3, z=2, and δ=0. In an embodiment, the compound according to Formula 1 can be $Li_7La_3Hf_2O_{12}$, $Li_7La_3Zr_2O_{12}$, or a combination thereof.

Mentioned are compounds of where $M^1$ is La, $M^2$ is Hf, and $M^3$ is Al, wherein $0 \leq x \leq 0.5$, such as $Li_{6.625}La_3Hf_2Al_{0.125}O_{12}$, $Li_{6.25}La_3Hf_2Al_{0.25}O_{12}$, $Li_{5.875}La_3Hf_2Al_{0.375}O_{12}$, or $Li_{5.5}La_3Hf_2Al_{0.5}O_{12}$.

Also mentioned are compounds where $M^1$ is La, $M^2$ is Hf, and $M^3$ is Ga, wherein $0 \leq x \leq 0.5$, such as $Li_{6.625}La_3Hf_2Ga_{0.125}O_{12}$, $Li_{6.25}La_3Hf_2Ga_{0.25}O_{12}$, $Li_{5.875}La_3Hf_2Ga_{0.375}O_{12}$, or $Li_{5.5}La_3Hf_2Ga_{0.5}O_{12}$.

In an embodiment, δ>0, for example $0<\delta\leq 2$. Thus, the compound according to Formula 1 can comprise an oxygen defect. An oxygen defect content δ in Formula 1 may be $0 \leq \delta \leq 1$, $0<\delta<1$, $0.1\leq\delta\leq0.9$, or $0.2\leq\delta\leq0.8$. While not wanting to be bound by theory, it is understood that including an oxygen defect in the compound of Formula 1 provides improved ionic conductivity, which is observed to result in unexpectedly improved dielectric properties. For example, $Li_{6.5}La_3Hf_2O_{11.75}$ and $Li_{6.5}La_3Zr_2O_{11.75}$ with δ=0.25 are specifically mentioned.

The compound of Formula 1 may be synthesized by combining, for example, $Li_2CO_3$, $La(OH)_3$, $HfO_2$, and a compound comprising $M^3$ if $M^3$ is present, in a suitable stoichiometric amount. For example, if $M^3$ is Al, $Al_2(CO_3)_3$ may be used. The mixture can be heat treated in a suitable container, such as a crucible, at temperature between 700° C.

and 1000° C. for two to 10 hours in air. The resulting material can be ground into a fine powder using a ball-mill for 30 minutes. If desired, a wet process, such as wet-milling in methanol may be used. The dried powder can again be treated at an appropriate temperature between 700° C. and 1000° C. for 2 to 24 hours to provide the desired phase. The product may be reground, e.g., by ball-milling if desired, to provide a suitable form. The particle size of the ball-milled powder can be smaller than 1 µm, or smaller than 5 µm. The ball-milled powder can be mixed with a suitable amount of a 3 weight percent (wt %) polyvinylalcohol (PVA) solution if desired, or pressed into a pellet without the PVA at a pressure between 1 and 10 tons. The pellet can be sintered for 2 to 4 hours in air at a temperature ranging from 1000° C. to 1300° C.

The dielectric material can optionally further comprise one or more additives, for example ceramic additives, a plasticizer, a binder, or a dispersant. A combination thereof may be used. In an embodiment, the dielectric material can include a binder. A binder can facilitate adherence between components of the dielectric material, and adherence of the dielectric material to an electrode. Examples of the binder can include polyacrylic acid (PAA), polyvinylidene fluoride, polyvinyl alcohol, carboxymethyl cellulose (CMC), starch, hydroxypropyl cellulose, regenerated cellulose, polyvinylpyrrolidone, tetrafluoroethylene, polyethylene, polypropylene, ethylene-propylene-diene monomer (EPDM), sulfonated EPDM, styrene-butadiene-rubber, fluorinated rubber, a copolymer thereof, or a combination thereof. The amount of the binder can be in a range of 1 part by weight to 10 parts by weight, for example, in a range of 2 parts by weight to 7 parts by weight, based on a total weight of the dielectric material. When the amount of the binder is in the range above, e.g., about 1 part by weight to about 10 parts by weight, the adherence of the dielectric material to the electrode may be suitably strong.

The electronic device comprising the dielectric material may be a capacitor or a field effect transistor. In an embodiment, the electronic device is a capacitor. In an embodiment, the capacitor is a ceramic capacitor.

In an embodiment, the capacitor can be a multilayer ceramic capacitor (MLCC). The multilayer ceramic capacitor comprises a ceramic body in which a plurality of dielectric layers are stacked. The multilayer ceramic capacitor includes first and second blocking inner electrodes which are opposite in polarity and are interspersed with the dielectric material layers comprising the compound of Formula 1. The first and second blocking inner electrodes are disposed to face each other along a direction of lamination of the ceramic dielectric layers and are electrically insulated from each other by the dielectric layers. Ends of the first and second blocking inner electrodes are alternately and respectively exposed to both ends of the ceramic capacitor body. The ends of the first and second blocking inner electrodes exposed to the ends of the ceramic capacitor body are electrically connected to the first and second blocking outer electrodes, respectively.

A schematic diagram of a multilayer ceramic capacitor (MLCC) is provided in FIG. 1. As shown in the multilayer ceramic capacitor 100 of FIG. 1, a first blocking outer electrode 101 can be used in combination with a second blocking outer electrode 102. In the MLCC 100 shown in FIG. 1, internal blocking electrodes 103A and 103B are formed which extend to the external electrodes 101 and 102, respectively. The internal electrodes 103A extending to a surface of the first electrode 101, as shown in FIG. 1, and the internal electrodes 103B extending to the opposite end surface of the second electrode 102. As shown, the internal electrodes are alternately disposed in an interdigitated fashion with layers of the dielectric material 104 therebetween. In an embodiment, the MLCC 100 may include a coating layer (not shown) disposed on at least one outer surface of the MLCC 100. When present, the coating can be a plating layer and can comprise, for example, nickel, copper, and the like or a combination thereof. Optionally, a second plating layer can be disposed on the first plating layer, wherein the second plating layer can comprise, for example, solder, tin, and the like, or a combination thereof.

If desired, the electronic device may also include other layers as is known in the art. For example, a protective coating may optionally be formed between the dielectric material and one or both of the first and second blocking electrodes. The protective coating may be provided by sputtering, chemical vapor deposition, or atomic layer deposition, for example. The details of such additional layers, including their composition and deposition, can be determined by one of skill in the art without undue experimentation.

The electronic device can be provided with outer electrodes which may serve as external terminals. For example, the electronic device may contain a first outer electrode to which the first blocking electrode of the electronic device is electrically connected and a second outer electrode to which the second blocking electrode of the electronic device is electrically connected. Any suitable conductive material may be employed to form the outer electrodes, such as a conductive metal, e.g., copper, nickel, silver, zinc, tin, palladium, lead, aluminum, molybdenum, titanium, iron, zirconium, magnesium, or an alloy thereof. Particularly suitable conductive metals may include copper, a copper alloy, e.g., copper-zirconium, copper-magnesium, copper-zinc, or copper-iron, nickel, a nickel alloy, e.g., nickel-iron. The thickness of the outer electrodes may be selected to minimize the thickness of the electronic device. For instance, the thickness of the outer electrodes may range from 0.05 to 1 millimeter, or 0.05 to 0.5 millimeters, or 0.07 to 0.2 millimeters. Optionally, the surface of the outer electrodes may be electroplated with nickel, silver, gold, or tin to provide suitable contacts with suitable stability and resistance to oxidation, for example. The details of the electroplating, including its composition and method of deposition, may be determined by one of skill in the art without undue experimentation.

The electronic device may be manufactured by providing the first blocking electrode, providing the second blocking electrode, and disposing the dielectric material between the first blocking electrode and the second blocking electrode. In an embodiment disposing the dielectric material between the first blocking electrode and the second blocking electrode can comprise forming a layer comprising the dielectric material on one of the first blocking electrode and the second blocking electrode. In an embodiment, a film comprising the compound of Formula 1 can be provided on a release layer, and the film disposed on at least one of the first blocking electrode and the second blocking electrode. The release layer can be removed, and then the first blocking electrode can be disposed on the second blocking electrode to manufacture the electronic device.

In an embodiment, the compound according to Formula 1 can be synthesized as described above, and the resulting powder can be combined with a suitable solvent to provide a slurry. The slurry can be applied to a carrier film, for example by a doctor blade method, or the like, and the applied slurry can be dried. The first and second blocking inner electrodes may be formed on a surface of the dielectric layer. Forming the first and second blocking inner electrodes can be by, for example, disposing a conductive paste comprising the conductive metal on a surface of the dielectric layer. The first and second blocking inner electrodes can be formed at a predetermined thickness. When the electronic device is a multilayer ceramic capacitor, the multilayer ceramic capacitor can be manufactured by forming a first internal blocking electrode on a first dielectric layer comprising the compound of Formula 1. A second internal blocking electrode can be formed on a second dielectric layer comprising the compound of Formula 1. The method further comprises forming a ceramic body by alternately stacking a plurality of first and second dielectric layers having the first and second internal blocking electrodes formed thereon and sintering the stacked sheets. First and second external blocking electrodes can be formed on opposite sides of the ceramic body so as to be electrically connected to the plurality of the first and second internal blocking electrodes to provide a multilayer ceramic capacitor.

This disclosure is further illustrated by the following examples, which are non-limiting.

EXAMPLES

Example 1

Phonon Dispersion

Phonon dispersion (including anharmonic contributions to the interatomic forces) of $Li_7La_3Zr_2O_{12}$ and $Li_7La_3Hf_2O_{12}$ was determined at 300K using self-consistent lattice dynamics (SCLD) and compressive-sensing lattice dynamics (CSLD) methods. Tables 1 and 2 show the intrinsic directional-dependent dielectric constant of $Li_7La_3Zr_2O_{12}$ and $Li_7La_3Hf_2O_{12}$, respectively, determined by SCLD and CSLD. As shown in Tables 1 and 2, both $Li_7La_3Zr_2O_{12}$ and $Li_7La_3Hf_2O_{12}$ exhibited high dielectric constants of greater than 10 at temperatures ranging from 300 to 1000 Kelvin. Tables 1 and 2 also show that the dielectric constants determined by SCLD and CSLD did not exhibit significant temperature dependence.

TABLE 1

| Temperature (K) | $\epsilon_{11}^{DC} = \epsilon_{22}^{DC}$ | $\epsilon_{33}^{DC}$ |
|---|---|---|
| 300 | 17.5 | 17.6 |
| 500 | 17.0 | 16.9 |
| 800 | 16.5 | 16.1 |
| 1000 | 16.1 | 15.7 |

TABLE 2

| Temperature (K) | $\epsilon_{11}^{DC} = \epsilon_{22}^{DC}$ | $\epsilon_{33}^{DC}$ |
|---|---|---|
| 300 | 16.9 | 15.5 |
| 500 | 16.2 | 14.7 |
| 800 | 15.4 | 13.9 |
| 1000 | 15.0 | 13.5 |

Example 2

Static Dielectric Constant

The ionic migration-induced static dielectric constant was also determined based on ab-initio molecular dynamics simulations as further disclosed in Eur Biophys J (2015) 44:599-611, the content of which is incorporated herein by reference in its entirety. The ionic migration induced directional dependent dielectric constants of $Li_{6.5}Al_{0.25}La_3Zr_2O_{12}$ and $Li_7La_3Hf_2O_{12}$ determined using ab-initio molecular dynamics simulations are shown in Tables 3 and 4, respectively.

TABLE 3

| Temperature (K) | $\epsilon_{11}^{DC}$ | $\epsilon_{22}^{DC}$ | $\epsilon_{33}^{DC}$ |
|---|---|---|---|
| 720 | $2.87 \times 10^5$ | $2.87 \times 10^5$ | $2.87 \times 10^5$ |
| 900 | $1.37 \times 10^5$ | $1.76 \times 10^5$ | $1.56 \times 10^5$ |
| 1200 | $1.55 \times 10^5$ | $1.85 \times 10^5$ | $2.40 \times 10^5$ |
| 1500 | $2.16 \times 10^5$ | $9.20 \times 10^5$ | $1.10 \times 10^5$ |

TABLE 4

| Temperature (K) | $\epsilon_{11}^{DC}$ | $\epsilon_{22}^{DC}$ | $\epsilon_{33}^{DC}$ |
|---|---|---|---|
| 720 | $1.88 \times 10^5$ | $3.24 \times 10^5$ | $3.72 \times 10^5$ |
| 900 | $1.34 \times 10^5$ | $2.86 \times 10^5$ | $2.27 \times 10^5$ |
| 1200 | $1.87 \times 10^5$ | $3.16 \times 10^5$ | $1.69 \times 10^5$ |
| 1500 | $5.80 \times 10^5$ | $4.55 \times 10^5$ | $5.20 \times 10^5$ |

As shown in Tables 3 and 4, it was surprisingly found that both $Li_{6.5}Al_{0.25}La_3Zr_2O_{12}$ and $Li_7La_3Hf_2O_{12}$ exhibited significantly increased dielectric constants (e.g., greater than $1 \times 10^5$) from the ionic-migration-induced polarization calculation described above. Without wishing to be bound by theory, it is believed that the dielectric constants of Example 2 shown in Tables 3 and 4 are due to lithium migration in the dielectric material. The high ionic diffusion in the tested compounds leads to large fluctuations in the instantaneous dipole moments of up to 1200 Debye/unit-cell. This result was unexpected as available materials do not exhibit such dielectric constants, which is believed to be due to the lack of diffusive elements.

Although the evaluations were performed at relatively high temperatures (e.g., 720 to 1500K), the observed high dielectric constants do not appear to have a strong temperature dependence. Accordingly, the materials of the present disclosure are also expected to be stable with the same phase at room temperature (e.g., 25° C.), and no phase transition is expected.

Example 3

Phase Stability of Representative Compositions

The stability of the compounds listed in Table 1 was evaluated by determining their energy above hull. Compounds having an energy above hull of less than 50 millielectron volts (meV) per atom at a temperature between 450° C. to 1200° C. are observed to be stable and included in Table 5. The energy above hull is a measure of the energy penalty paid to dope the structure.

TABLE 5

| Dopant | Composition | Energy above hull (meV/atom) | Possible impurity phases during synthesis |
|---|---|---|---|
| None | $Li_7La_3Hf_2O_{12}$ | 9.8 | |
| Al | $Li_{6.625}La_3Hf_2Al_{0.125}O_{12}$ | 16.6 | $Li_5AlO_4$; $Li_6Hf_2O_7$; $La_2O_3$ |
| | $Li_{6.25}La_3Hf_2Al_{0.25}O_{12}$ | 21.0 | $LiAlO_2$; $Li_6Hf_2O_7$; $La_2O_3$ |
| | $Li_{5.875}La_3Hf_2Al_{0.375}O_{12}$ | 18.9 | $LiAlO_2$; $La_2Hf_2O_7$; $Li_6Hf_2O_7$; $La_2O_3$ |
| | $Li_{5.5}La_3Hf_2Al_{0.5}O_{12}$ | 20.8 | $LiAlO_2$; $La_2Hf_2O_7$; $Li_6Hf_2O_7$; $La_2O_3$ |
| Ga | $Li_{6.625}La_3Hf_2Ga_{0.125}O_{12}$ | 16.9 | $Li_5GaO_4$; $Li_6Hf_2O_7$; $La_2O_3$ |
| | $Li_{6.25}La_3Hf_2Ga_{0.25}O_{12}$ | 21.3 | $LiGaO_2$; $Li_6Hf_2O_7$; $La_2O_3$ |
| | $Li_{5.875}La_3Hf_2Ga_{0.375}O_{12}$ | 19.1 | $LiGaO_2$; $Li_6Hf_2O_7$; $La_2Hf_2O_7$; $La_2O_3$ |
| | $Li_{5.5}La_3Hf_2Ga_{0.5}O_{12}$ | 21.3 | $LiGaO_2$; $La_2Hf_2O_7$; $Li_6Hf_2O_7$; $La_2O_3$ |
| Ta | $Li_{6.875}La_3Hf_{1.875}Ta_{0.125}O_{12}$ | 13.3 | $Li_5TaO_5$; $Li_6Hf_2O_7$; $Li_2O$ $La_2O_3$ |
| | $Li_{6.75}La_3Hf_{1.75}Ta_{0.25}O_{12}$ | 16.2 | $Li_5TaO_5$; $Li_6Hf_2O_7$; $Li_2O$ $La_2O_3$ |
| | $Li_{6.625}La_3Hf_{1.625}Ta_{0.375}O_{12}$ | 16.5 | $Li_5TaO_5$; $Li_6Hf_2O_7$; $Li_3TaO_4$; $La_2O_3$ |
| | $Li_{6.5}La_3Hf_{1.5}Ta_{0.5}O_{12}$ | 15.0 | $Li_5TaO_5$; $Li_6Hf_2O_7$; $Li_3TaO_4$; $La_2O_3$ |
| | $Li_{6.375}La_3Hf_{1.375}Ta_{0.625}O_{12}$ | 17.0 | $Li_5TaO_5$; $Li_6Hf_2O_7$; $Li_3TaO_4$; $La_2O_3$ |
| | $Li_{6.25}La_3Hf_{1.25}Ta_{0.75}O_{12}$ | 18.8 | $Li_5TaO_5$; $Li_6Hf_2O_7$; $Li_3TaO_4$; $La_2O_3$ |
| Nb | $Li_{6.875}La_3Hf_{1.875}Nb_{0.125}O_{12}$ | 12.5 | $Li_8Nb_2O_9$; $Li_6Hf_2O_7$; $Li_2O$; $La_2O_3$ |
| | $Li_{6.75}La_3Hf_{1.75}Nb_{0.25}O_{12}$ | 16.5 | $Li_8Nb_2O_9$; $Li_6Hf_2O_7$; $Li_2O$; $La_2O_3$ |
| | $Li_{6.625}La_3Hf_{1.625}Nb_{0.375}O_{12}$ | 16.3 | $Li_8Nb_2O_9$; $Li_6Hf_2O_7$; $La_2O_3$ |
| | $Li_{6.5}La_3Hf_{1.5}Nb_{0.5}O_{12}$ | 17.5 | $Li_8Nb_2O_9$; $Li_6Hf_2O_7$; $La_2O_3$ |
| | $Li_{6.375}La_3Hf_{1.375}Nb_{0.625}O_{12}$ | 20.1 | $Li_8Nb_2O_9$; $Li_6Hf_2O_7$; $Li_3NbO_4$; $La_2O_3$ |
| | $Li_{6.25}La_3Hf_{1.25}Nb_{0.75}O_{12}$ | 22.1 | $Li_8Nb_2O_9$; $Li_6Hf_2O_7$; $Li_3NbO_4$; $La_2O_3$ |
| W | $Li_{6.75}La_3Hf_{1.875}W_{0.125}O_{12}$ | 14.2 | $Li_6Hf_2O_7$; $Li_2O$; $Li_4WO_5$; $La_2O_3$ |
| | $Li_{6.5}La_3Hf_{1.75}W_{0.25}O_{12}$ | 19.0 | $Li_6Hf_2O_7$; $Li_2O$; $Li_4WO_5$; $La_2O_3$ |
| | $Li_{6.25}La_3Hf_{1.625}W_{0.375}O_{12}$ | 20.7 | $Li_6Hf_2O_7$; $Li_6Hf_2O_7$; $Li_4WO_5$; $La_2O_3$ |
| | $Li_6La_3Hf_{1.5}W_{0.5}O_{12}$ | 27.0 | $Li_6Hf_2O_7$; $Li_6Hf_2O_7$; $Li_4WO_5$; $La_2O_3$ |
| Al and Zr | $Li_{6.625}La_3HfZrAl_{0.125}O_{12}$ | 14.9 | $Li_5AlO_4$; $Li_6Zr_2O_7$; $La_2O_3$; $Li_6Hf_2O_7$ |
| | $Li_{6.25}La_3HfZrAl_{0.25}O_{12}$ | 19.2 | $LiAlO_2$; $Li_6Zr_2O_7$; $La_2O_3$; $Li_6Hf_2O_7$ |
| | $Li_{5.875}La_3HfZrAl_{0.375}O_{12}$ | 19.4 | $LiAlO_2$; $Li_6Zr_2O_7$; $La_2O_3$; $La_2Zr_2O_7$; $Li_6Hf_2O_7$ |
| | $Li_{5.5}La_3HfZrAl_{0.5}O_{12}$ | 19.2 | $LiAlO_2$; $Li_6Zr_2O_7$; $La_2O_3$; $La_2Zr_2O_7$; $Li_6Hf_2O_7$ |
| Ta and Zr | $Li_{6.75}La_3Hf_{0.875}Zr_{0.875}Ta_{0.25}O_{12}$ | 13.8 | $Li_5TaO_5$; $Li_6Hf_2O_7$; $Li_6Hf_2O_7$; $Li_2O$; $La_2O_3$ |
| | $Li_{6.5}La_3Hf_{0.75}Zr_{0.75}Ta_{0.5}O_{12}$ | 13.4 | $Li_5TaO_5$; $Li_6Zr_2O_7$; $Li_6Hf_2O_7$; $Li_3TaO_4$; $La_2O_3$ |
| | $Li_{6.25}La_3Hf_{0.625}Zr_{0.625}Ta_{0.75}O_{12}$ | 17.4 | $Li_5TaO_5$; $Li_6Zr_2O_7$; $Li_6Hf_2O_7$; $Li_3TaO_4$; $La_2O_3$ |

Example 4

Activation Energy and Ionic Conductivity

Figure 2:
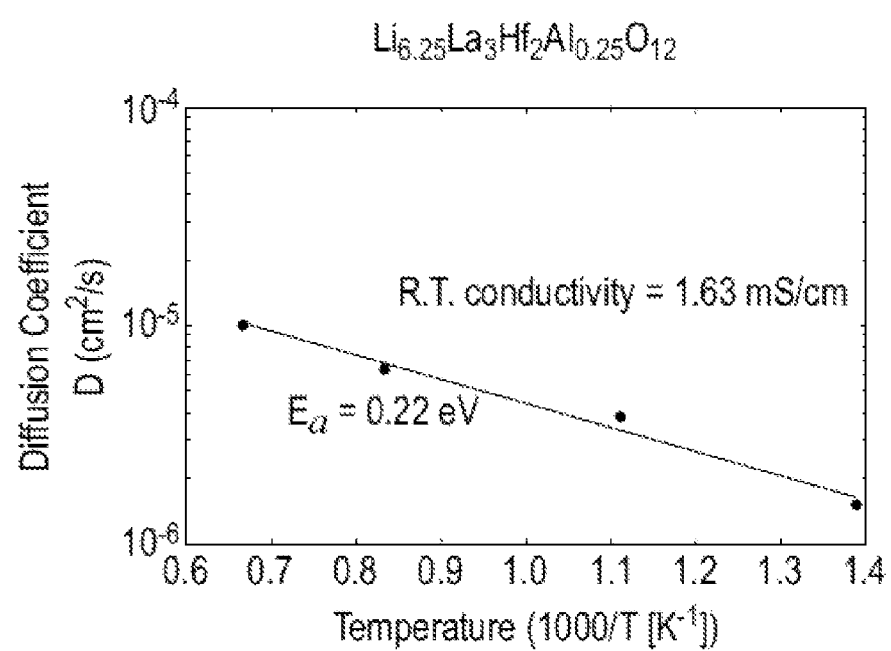
FIG. 2 is a graph of diffusivity (square centimeters per second) versus inverse temperature (1/Kelvin) illustrating the activation energy and conductivity of the composition $Li_{6.25}La_3Hf_2Al_{0.25}O_{12}$.

The activation energy and ionic conductivity was determined for selected compositions by ab-initio molecular dynamics. FIG. 2 is graph of diffusivity versus the inverse of temperature for $Li_{6.25}La_3Hf_2Al_{0.25}O_{12}$. As shown in FIG. 2, the activation energy is 0.22 electron-volts (eV) and the conductivity at 300K is 1.63 milliSiemens per centimeter (mS/cm).

Example 5

Synthesis of $Li_{6.55}La_3Hf_{1.55}Ta_{0.45}O_{12}$ $Li_2CO_3$, $La(OH)_3$, $HfO_2$, and $Ta_2O_5$ are used as received. A mixture of stoichiometric amounts of the $Li_2CO_3$, $La(OH)_3$, $HfO_2$, and $Ta_2O_5$ for $Li_{6.55}La_3Hf_{1.55}Ta_{0.45}O_{12}$ are dry-ball milled for 30 minutes at 1725 rpm with 12 mm YSZ balls. 95 weight percent (wt %) of the resulting material is calcined at 950° C. for 12 hours in air. The calcined product is ground, then uniaxially pressed into a pellet, the pellet covered with the remaining 5 wt % of the remaining milled powder to prevent loss of lithium, and then the covered pellet sintered at 1100° C. for 4 hours in air.

Figure 3:
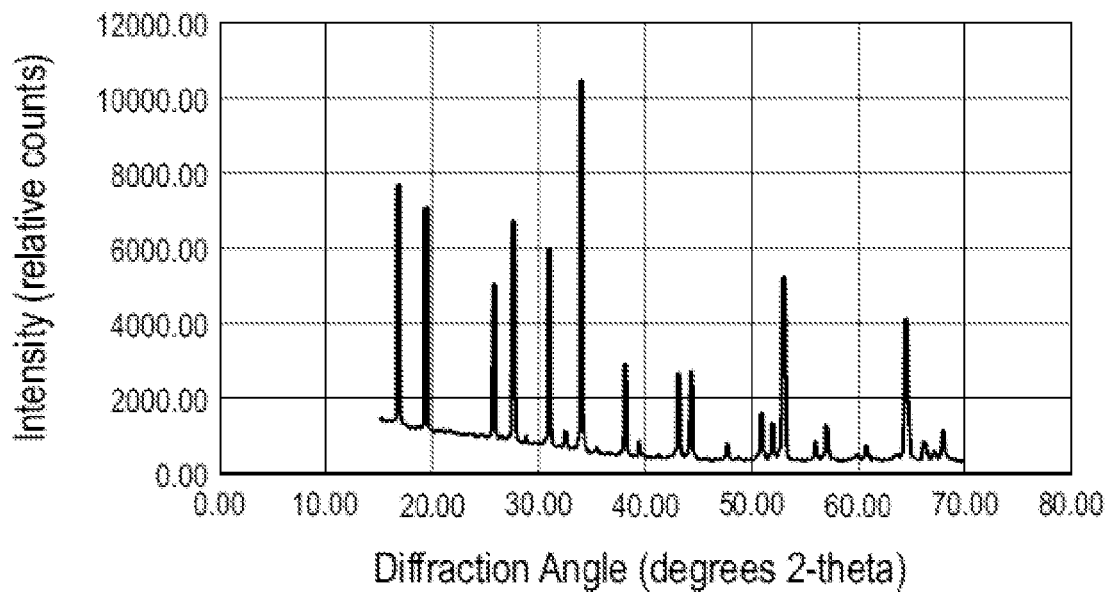
FIG. 3 is a graph of intensity (relative counts) versus diffraction angle (degrees 2-theta) for the $Li_{6.55}La_3Hf_{1.55}Ta_{0.45}O_{12}$ product of Example 5, when analyzed by X-ray powder diffraction using Cu Kα radiation.

The product was analyzed by X-ray powder diffraction. Shown in FIG. 3 is a graph of intensity versus diffraction angle for the sintered product.

Example 6

Synthesis of $Li_{6.25}Hf_2La_3Mg_{0.375}O_{12}$ $Li_2CO_3$, $La(OH)_3$, $HfO_2$, and MgO are used as received. A mixture of stoichiometric amounts of the $Li_2CO_3$, $La(OH)_3$, $HfO_2$, and MgO for $Li_{6.25}Hf_2La_3Mg_{0.375}O_{12}$ are dry-ball milled for 30 minutes at 1725 rpm with 12 mm YSZ balls. 95 wt % of the resulting material is calcined at 950° C. for 12 hours in air. The calcined product is ground, then uniaxially pressed into a pellet, the pellet covered with the remaining 5 wt % of the remaining milled powder to prevent loss of lithium, and then the covered pellet sintered at 1100° C. for 4 hours in air.

Figure 4:
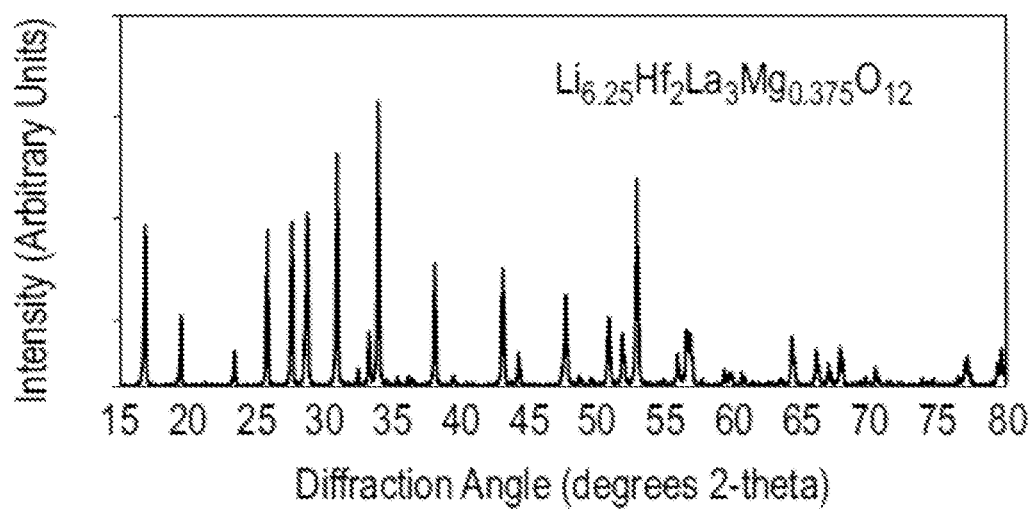
FIG. 4 is a graph of intensity (arbitrary units) versus diffraction angle (degrees 2-theta) for the $Li_{6.25}La_3Hf_2Mg_{0.375}O_{12}$ product of Example 6, when analyzed by X-ray powder diffraction using Cu Kα radiation.

The product was analyzed by X-ray powder diffraction. Shown in FIG. 4 is a graph if intensity versus diffraction angle for the sintered product.

Figure 5:
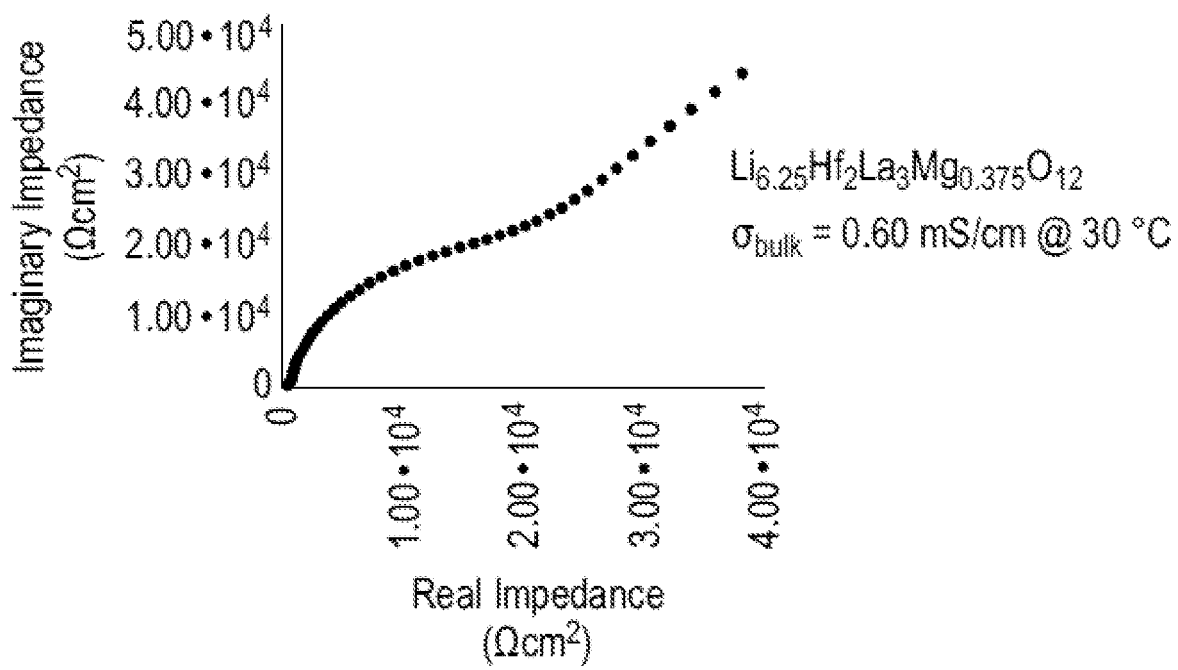
FIG. 5 is a graph of imaginary resistance ($Z_2$, ohms-square centimeters, $\Omega cm^2$) versus real resistance ($Z_1$, ohms-square centimeters, $\Omega cm^2$) which shows the results of impedance analysis of the $Li_{6.25}La_3Hf_2Mg_{0.375}O_{12}$ product of Example 6.

Bulk conductivity was determined by impedance spectroscopy. The product was found to have a bulk conductivity ($\sigma_{bulk}$) of 0.60 mS/cm at 30° C., as shown in FIG. 5.

Example 7

Static Dielectric Constant in Presence of Oxygen Deficiency

The ionic migration-induced static dielectric constant was also determined based on ab-initio molecular dynamics simulations as further disclosed in Eur Biophys J (2015) 44:599-611, the content of which is incorporated herein by reference in its entirety. The ionic migration induced directional dependent dielectric constants of $Li_{65}La_3Zr_2O_{11.75}$ and $Li_{6.5}La_3Hf_2O_{11.75}$ determined using ab-initio molecular dynamics simulations are shown in Tables 5 and 6, respectively.

TABLE 5

| Temperature (K) | $\epsilon_{11}^{DC}$ | $\epsilon_{22}^{DC}$ | $\epsilon_{33}^{DC}$ |
| --- | --- | --- | --- |
| 1200 | $1.82 \times 10^5$ | $1.04 \times 10^5$ | $5.40 \times 10^4$ |
| 1500 | $1.27 \times 10^5$ | $2.01 \times 10^5$ | $3.08 \times 10^4$ |

TABLE 6

| Temperature (K) | $\epsilon_{11}^{DC}$ | $\epsilon_{22}^{DC}$ | $\epsilon_{33}^{DC}$ |
| --- | --- | --- | --- |
| 1200 | $1.11 \times 10^5$ | $1.31 \times 10^5$ | $3.88 \times 10^5$ |
| 1500 | $2.52 \times 10^5$ | $1.03 \times 10^5$ | $1.54 \times 10^5$ |

As shown in Tables 5 and 6, it was surprisingly found that both $Li_{6.5}La_3Zr_2O_{11.75}$ and $Li_{65}La_3Hf_2O_{11.75}$ exhibited significantly increased dielectric constants (e.g., greater than $1 \times 10^4$) from the ionic-migration-induced polarization calculation described above. Without wishing to be bound by theory, it is believed that the dielectric constants of Example 7 shown in Tables 5 and 6 are due to lithium migration in the dielectric material. The high ionic diffusion in the tested compounds leads to large fluctuations in the instantaneous dipole moments of up to 1200 Debye/unit-cell. This result was unexpected as available materials do not exhibit such dielectric constants, which is believed to be due to the lack of diffusive elements.

Although the evaluations were performed at relatively high temperatures (e.g., 1200 to 1500K), the observed high dielectric constants do not appear to have a strong temperature dependence. Accordingly, the materials of the present disclosure are also expected to be stable with the same phase at room temperature (e.g., 25° C.), and no phase transition is expected.

Various embodiments are shown in the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, or sections, these elements, components, regions, layers, or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises" and/or "comprising," or "includes" or "including" when used in this specification, specify the presence of stated features, regions, integers, steps, operations, elements, or components, but do not preclude the presence or addition of one or more other features, regions, integers, steps, operations, elements, components, or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

While a particular embodiment has been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. An electronic device comprising
a first blocking electrode;
a second blocking electrode; and
a dielectric material disposed between the first electrode and the second electrode, the dielectric material comprising a compound of Formula 1

$$Li_{24-b*y-c*z-a*x}M^1_yM^2_zM^3_xO_{12-\delta} \quad (1)$$

wherein
$M^1$ is a cationic element having an oxidation state of b, wherein b is +1, +2, +3, +4, +5, +6, or a combination thereof;
$M^2$ is a cationic element having an oxidation state of c, wherein c is +1, +2, +3, +4, +5, +6, or a combination thereof;
$M^3$ is a cationic element having an oxidation state of a, wherein a is +1, +3, +4, or a combination thereof;
$0 \leq y \leq 3$;
$0 \leq z \leq 3$;
$0 \leq x \leq 5$; and
$0 \leq \delta \leq 2$;
wherein the electronic device is a capacitor.

2. The electronic device of claim 1, wherein the capacitor is a ceramic capacitor.

3. The electronic device of claim 1, wherein the capacitor is a multilayer ceramic capacitor comprising a plurality of layers of the dielectric material.

4. The electronic device of claim 3, wherein each layer of the dielectric material is disposed between alternating layers of the first blocking electrode and the second blocking electrode.

5. The electronic device of claim 1, wherein the compound of Formula 1 has a garnet-type structure comprising 8-fold coordinated $M^1O_8$ dodecahedra and 6-fold coordinated $M^2O_6$ octahedra, and wherein the Li and $M^3$ sites are tetrahedral interstitial sites, octahedral interstitial sites, distorted 4-fold coordination interstitial sites, or a combination thereof.

6. The electronic device of claim 1, wherein the dielectric material exhibits a dielectric constant of greater than 10 to 25, when determined at 300 Kelvin according to ASTM D150-18.

7. The electronic device of claim 1, wherein the dielectric material exhibits a dielectric constant of greater than $1 \times 10^3$ to $1 \times 10^6$, when determined at 720 to 1500 Kelvin according to ASTM D 150-18.

8. The electronic device of claim 1, wherein the dielectric material exhibits a dielectric constant of greater than $1 \times 10^3$, when determined at 300 Kelvin according to ASTM D150-18.

9. The electronic device of claim 1, wherein the dielectric material exhibits an ionic conductivity of greater than 0.1 mS/cm at a temperature of 30° C.

10. The electronic device of claim 1, wherein $M^1$ is $Na^+$, $K^+$, $Ca^{2+}$, $Mg^{2+}$, $Sr^{2+}$, $Ba^{2+}$, $Y^{3+}$, $In^{3+}$, $La^{3+}$, $Sc^{3+}$, $Hf^{4+}$, $Zr^{4+}$, $Ti^{4+}$, $Sn^{4+}$, $Si^{4+}$, $Ge^{4+}$, $Ta^{5+}$, $Nb^{5+}$, $W^{6+}$, or a combination thereof.

11. The electronic device of claim 1, wherein $M^2$ is $Na^+$, $K^+$, $Ca^{2+}$, $Mg^{2+}$, $Sr^{2+}$, $Ba^{2+}$, $Y^{3+}$, $In^{3+}$, $La^{3+}$, $Sc^{3+}$, $Hf^{4+}$, $Zr^{4+}$, $Ti^{4+}$, $Sn^{4+}$, $Si^{4+}$, $Ge^{4+}$, $Ta^{5+}$, $Nb^{5+}$, $W^{6+}$, or a combination thereof.

12. The electronic device of claim 1, wherein $M^3$ is $H^+$, $Al^{3+}$, $Ga^{3+}$, $Sn^{4+}$, $Si^{4+}$, $Ge^{4+}$, or a combination thereof.

13. The electronic device of claim 1, wherein y=3, z=2, x=0, and δ=0.

14. The electronic device of claim 1, wherein $M^1$ has an oxidation state of b, wherein b is +3.

15. The electronic device of claim 1, wherein $M^2$ has an oxidation state of c, wherein c is 4+.

16. The electronic device of claim 1, wherein $M^1$ and $M^2$ are different.

17. The electronic device of claim 1, wherein $M^1$ is $La^{3+}$.

18. The electronic device of claim 1, wherein $M^2$ is $Hf^{4+}$, $Zr^{4+}$, or a combination thereof.

19. The electronic device of claim 1, wherein the compound of Formula 1 is $Li_7La_3Hf_2O_{12}$, $Li_7La_3Zr_2O_{12}$, or a combination thereof.

20. A method for the manufacture of the electronic device of claim 1, the method comprising
providing a first blocking electrode;
forming a layer comprising the dielectric material on the first blocking electrode; and
forming a second blocking electrode on the layer comprising the dielectric material.

21. The method of claim 20, wherein forming the layer comprising the dielectric material comprises sputtering or anodization.

22. A method for the manufacture of the electronic device of claim 1, wherein the electronic device is a multilayer ceramic capacitor, the method comprising
forming a first internal blocking electrode on a first dielectric material comprising the compound of Formula 1;
forming a second internal blocking electrode on a second dielectric material comprising the compound of Formula 1;
forming a multilayer ceramic body by alternately disposing a plurality of first and second dielectric materials having the first and second internal blocking electrodes disposed thereon;
sintering the multilayer ceramic body; and
forming a first external blocking electrode and a second external blocking electrode on opposing sides of the multilayer ceramic body, wherein the first and second external blocking electrodes are electrically connected to the plurality of the first and second internal blocking electrodes.

23. An electronic device comprising:
a first blocking electrode;
a second blocking electrode;
a dielectric material disposed between the first electrode and the second electrode, the dielectric material comprising a compound of Formula 1:

$$Li_{24-b*y-c*z-a*x}M^1_yM^2_zM^3_xO_{12-\delta} \quad (1)$$

wherein
$M^1$ is a cationic element having an oxidation state of b, wherein b is +1, +2, +3, +4, +5, +6, or a combination thereof;
$M^2$ is a cationic element having an oxidation state of c, wherein c is +1, +2, +3, +4, +5, +6, or a combination thereof;
$M^3$ is a cationic element having an oxidation state of a, wherein a is +1, +3, +4, or a combination thereof;
$0 \leq y \leq 3$;
$0 \leq z \leq 3$;
$0 \leq x \leq 5$; and
$0 \leq \delta \leq 2$;
wherein the electronic device is a field effect transistor.

24. An electronic device comprising
a first blocking electrode;
a second blocking electrode; and
a dielectric material disposed between the first electrode and the second electrode, the dielectric material comprising a compound of Formula 1:

$$Li_{24-b*y-c*z-a*x}M^1_yM^2_zM^3_xO_{12-\delta} \qquad (1)$$

wherein
$M^1$ is a cationic element having an oxidation state of b, wherein b is +1, +2, +3, +4, +5, +6, or a combination thereof;
$M^2$ is a cationic element having an oxidation state of c, wherein c is +1, +2, +3, +4, +5, +6, or a combination thereof;
$M^3$ is a cationic element having an oxidation state of a, wherein a is +1, +3, +4, or a combination thereof;
$0 \leq y \leq 3$;
$0 \leq z \leq 3$;
$0 \leq x \leq 5$; and
$\delta > 0$.

25. The electronic device of claim 24, wherein the compound of Formula 1 is $Li_{6.5}La_3Hf_2O_{11.75}$, $Li_{6.5}La_3Zr_2O_{11.75}$, or a combination thereof.

* * * * *